(12) United States Patent
Kawamoto et al.

(10) Patent No.: US 6,416,384 B1
(45) Date of Patent: *Jul. 9, 2002

(54) METHOD AND APPARATUS FOR POLISHING

(75) Inventors: Takayoshi Kawamoto; Norio Kimura; Hozumi Yasuda, all of Fujisawa; Hiroshi Yoshida, Yokohama, all of (JP)

(73) Assignee: Ebara Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/126,088

(22) Filed: Jul. 30, 1998

(30) Foreign Application Priority Data

Jul. 30, 1997 (JP) ............................................. 9-219148

(51) Int. Cl.⁷ ................................................. B24B 49/00
(52) U.S. Cl. ...................... 451/7; 451/8; 451/9; 451/41; 451/53
(58) Field of Search ................................ 451/7, 41, 53, 451/285, 287, 8, 9, 449, 488

(56) References Cited

U.S. PATENT DOCUMENTS

| | | | |
|---|---|---|---|
| 4,450,652 A | | 5/1984 | Walsh |
| 5,104,828 A | | 4/1992 | Morimoto et al. |
| 5,127,196 A | | 7/1992 | Morimoto et al. |
| 5,597,442 A | * | 1/1997 | Chen et al. |
| 5,605,488 A | * | 2/1997 | Ohashi et al. |
| 5,882,244 A | * | 3/1999 | Hiyama et al. |
| 5,989,355 A | * | 11/1999 | Brandt et al. |

* cited by examiner

Primary Examiner—Timothy V. Eley
Assistant Examiner—Willie Berry, Jr.
(74) Attorney, Agent, or Firm—Wenderoth, Lind, & Ponack, L.L.P.

(57) ABSTRACT

A polishing apparatus can improve the uniformity of thickness within a workpiece or reduce thickness variation between serially polished workpieces. The polishing apparatus comprises a polishing unit having a polishing tool for providing a polishing surface and a workpiece holding device for holding the workpiece. A polishing solution or liquid supplying device is provided for supplying a polishing solution or liquid into a polishing interface between the surface of the workpiece and the polishing surface. A temperature of the polishing interface is controlled according to at least an ambient temperature of a polishing space surrounding the polishing unit, as a variable parameter.

30 Claims, 3 Drawing Sheets

METHOD AND APPARATUS FOR POLISHING

BACKGROUND OF THE INVENTION

1. Field of the Invention

The present invention relates in general to a polishing apparatus and method, and relates in particular to a polishing apparatus and method for precision polishing of a workpiece such as semiconductor wafer to a flat and mirror finish.

2. Description of the Related Art

As semiconductor devices become more highly integrated, wiring spacing becomes finer and interline spacing also becomes very narrow. Photolithographic reproduction of circuits using stepper printing processes for such highly integrated devices requires the depth of focus be very shallow so that the wafer surface must be extremely flat.

A known method of producing a flat surface on a semiconductor wafer is to press the wafer held on a holding device against a polishing tool such as, for example, a polishing table with a polishing cloth mounted thereon, and to supply a polishing solution or polishing liquid to the interface while sliding the tool relative to the wafer. This chemical-mechanical polishing process employs, in addition to a mechanical polishing process using abrasive grains, a chemical polishing process using acidic or alkaline solutions.

In such an apparatus, it is known that the removal rate of the surface material (polishing speed) is dependent not only on the force pressing the wafer against the polishing tool (polishing cloth) and sliding speed, but also the temperature of the polishing interface (polishing temperature). It is important to be able to control the polishing speed constant, not only for producing high flatness but also for determining correctly an endpoint of a polishing process.

Therefore, wafer quality control, such as flatness control within a wafer, control of variation in flatness from wafer to wafer, and endpoint determination are all related to the ability to control the polishing interface at a desired temperature. Consistency in the flatness from wafer to wafer is particularly important in improving the reproducibility of the quality of wafers produced in a serial polishing process.

Further, the polishing interface temperature is a particularly crucial element when polishing a semiconductor wafer provided with different types of thin films provided on the same surface. Such combination includes an oxide film and nitride film combination, and a combination of a metal film such as tungsten or titanium and a barrier layer such as titanium nitride or oxide.

It is anticipated that the polishing interface temperature is governed by a heat balance between heat generated by frictional forces of polishing, heat generated or removed by a polishing solution supplied to the polishing interface, and heat conduction through the wafer holding section and polishing tools. Therefore, current practices are to control the polishing solution temperature and to use a polishing table having internal cooling passages to keep the polishing table at a constant temperature.

However, it has been difficult to maintain the polishing interface temperature at a target temperature by relying only on controlling the polishing solution and polishing table temperatures of a polishing apparatus. Polishing performance at inconsistent temperatures has been a cause of wafer-to-wafer variation in thickness of films or non-uniformity of flatness within a wafer. Such a variation in wafer thickness also makes it difficult to determine an endpoint of polishing based on a target thickness.

SUMMARY OF THE INVENTION

It is an object of the present invention to provide an apparatus and a method capable of improving the uniformity of thickness within a workpiece or reducing thickness variation between serially polished workpieces, and to facilitate detection of an endpoint of polishing.

Such object has been achieved in a polishing apparatus for polishing a surface on a workpiece comprising: a polishing unit having a polishing tool such as a polishing table for providing a polishing surface and a workpiece holding device for holding the workpiece; and a polishing solution supplying device for supplying a polishing solution or polishing liquid into a polishing interface between the surface of the workpiece and the polishing surface, wherein a temperature of the polishing interface is controlled according to at least an ambient temperature of a polishing space surrounding the polishing unit, as a variable parameter.

Accordingly, the ambient temperature, for example, may be maintained at a target polishing temperature to perform precision polishing so that the polished workpiece will have less variation in thickness, thereby producing polished workpieces of a high surface quality with high yield. "Polishing space" means any space surrounding the polishing unit which includes at least a polishing tool and a workpiece holding device. Such "polishing space" includes a polishing room divided by partition walls for compartmenting the polishing space from an outer clean room in a semiconductor manufacturing facility or from a storage space for storing clean wafers, or, in a case without any such partition walls, any space for installing the polishing unit. Normally, the room is provided with air supply and air exhaust devices, and a temperature control device is provided at the air supply device to control the ambient temperature.

The apparatus may be provided with an ambient temperature control device to maintain the polishing space at a specific temperature. The specific temperature is set close to the target temperature so as not to influence the polishing temperature by fluctuations in the ambient temperature.

The apparatus may be provided with a solution temperature control device to control the polishing solution or liquid at a specific temperature and a tool temperature control device to maintain a thermal medium, flowing in an internal passage in the polishing tool, at a specific temperature. These are important elements of the polishing parameters and affect the polishing temperature greatly, therefore, precise control over the polishing temperature can be provided by controlling these parameters together with the ambient temperature.

The apparatus may be provided with a sensor device to detect a polishing surface temperature. Precise control can be carried out by determining the temperature of objects to be controlled directly or indirectly.

The ambient temperature control device should maintain air temperature of the air being supplied to the polishing space in a form of a downflow. This arrangement reduces swirling up of dust particles so that the air flow is directed to enable a clean environment to be maintained.

In another aspect of the invention, a polishing apparatus for polishing a surface on a workpiece comprises: a polishing unit having a polishing tool for providing a polishing surface and a workpiece holding device for holding the workpiece; a polishing solution supplying device for supplying a polishing solution or polishing liquid into a polishing interface between the surface of the workpiece and the polishing surface; an ambient temperature sensor for directly or indirectly detecting an ambient temperature of a polishing space surrounding the polishing unit; and a polishing temperature control device for maintaining a polishing temperature at the polishing interface according to detected results of the ambient temperature sensor.

The polishing space surrounding the polishing unit is normally divided with walls and a door is provided for transferring the workpiece in and out of the polishing space.

The polishing temperature control device may control the polishing interface temperature by controlling the tool temperature or the solution temperature. The temperature of the polishing space itself may also be controlled, and a temperature detecting device for detecting a temperature of the polishing interface may be provided so that results may be used to control the polishing temperature. The detection device may be a type to detect the temperature of a polishing tool surface or a surface temperature of the workpiece being polished.

Another aspect of the invention is a method for controlling a surface temperature of a workpiece being polished by a polishing apparatus, the apparatus comprising a polishing unit having a polishing tool for providing a polishing surface and a workpiece holding device for holding the workpiece, and polishing solution supplying device for supplying a polishing solution or polishing liquid into a polishing interface between the surface of the workpiece and the polishing surface, wherein respective temperatures of the polishing solution or polishing liquid, a thermal medium flowing internally in the polishing tool and a polishing space surrounding the polishing unit are controlled so as to maintain a temperature of the polishing interface at a target polishing temperature.

The respective temperatures of the polishing solution, a thermal medium flowing internally in the polishing tool and a polishing space surrounding the polishing unit may be controlled substantially the same. These are the elements that affect the polishing temperature greatly, and by making them all the same, more precise polishing can be carried out relatively simply.

The temperatures of the polishing solution or polishing liquid, a thermal medium flowing internally in the polishing tool and a polishing space surrounding the polishing unit may be controlled according to a detected temperature of the polishing interface.

Another aspect of the invention is a method for controlling a surface temperature of a workpiece being polished by a polishing apparatus, the apparatus comprising a polishing unit having a polishing tool for providing a polishing surface and a workpiece holding device for holding the workpiece, and polishing solution supplying device for supplying a polishing solution or polishing liquid into a polishing interface between the surface of the workpiece and the polishing surface, wherein a solution temperature is controlled according to an ambient temperature in a polishing space surrounding the polishing unit and a target polishing temperature.

In the above method, a medium temperature circulating internally in the polishing tool may be controlled to maintain the polishing tool at a specific temperature.

DESCRIPTION OF THE PREFERRED EMBODIMENTS

Figure 1:
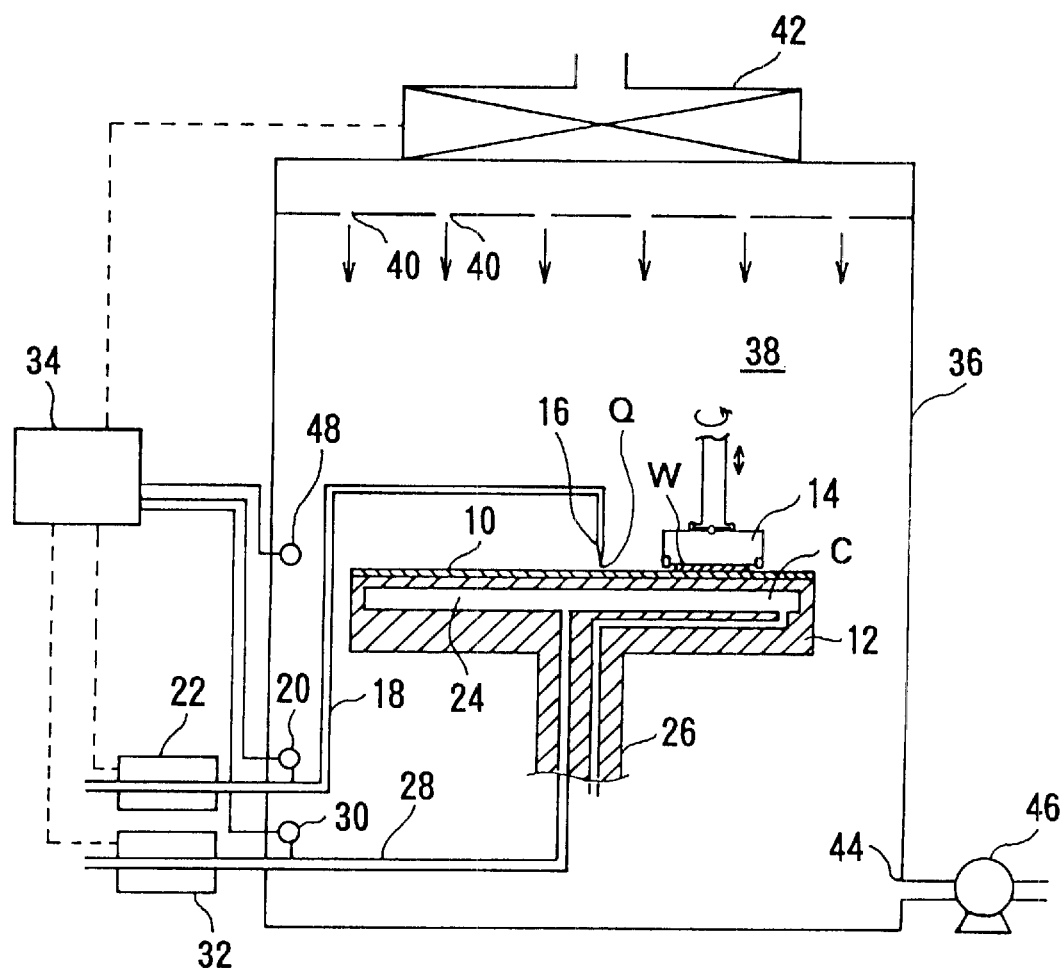
FIG. 1 is an overall cross sectional view of the polishing apparatus of the present invention.

In the following, an embodiment will be presented with reference to FIG. 1.

The polishing apparatus comprises a polishing unit comprised by a polishing table (polishing tool) 12 having a polishing cloth 10 mounted on its top surface and a top ring 14 for holding a wafer on its bottom surface to press against the polishing cloth 10, and a supply nozzle 16 to supply a polishing solution or polishing liquid Q onto the polishing cloth 10. The surface of the polishing cloth 10 constitutes a polishing surface.

The apparatus is provided with driving devices not shown in the drawing for independently rotating the polishing table 12 and the top ring 14, and a pressing device (air cylinder, for example) to press the top ring 14 onto the polishing table 12. The polishing solution Q is supplied from a polishing solution supply system through a solution delivery pipe 18 to be supplied through the supply nozzle 16. A temperature sensor 20 for measuring the solution temperature and a solution temperature adjusting device 22 for heating or cooling the polishing solution Q are provided at selected locations of the polishing solution supply system.

The polishing table 12 is provided with an internal medium space 24, for flowing a thermal medium (cooling/heating) C, communicating with an external thermal medium supply pipe 28 of a thermal medium supply system through a thermal medium passage formed in a rotation shaft 26 which supports the polishing table 12. The thermal medium supply system is also provided with a medium temperature adjusting device 32 having a temperature sensor 30 for detecting the temperature of the thermal medium C. Output data from the temperature sensors 20, 30 are input into a main controller 34 which outputs control signals to the temperature adjusting devices 22, 32.

The polishing apparatus is housed in an enclosed polishing room (polishing space) 38 formed by dividing walls 36 to separate the polishing room 38 from the surrounding spaces. The polishing apparatus is provided with an air conditioning apparatus 42 which draws outdoor air and passes it through a filter section to remove dust particles and, after adjusting the temperature and humidity, supplies the conditioned air to the polishing room by uniformly dispersing the air through duct openings 40 provided at the upper section of the polishing room 38. An exhaust pump 46 is provided to exhaust the air including mist and abrasive particles through exhaust duct opening 44 provided in the bottom section of the polishing room 38.

These arrangements produce consistent down drafts of clean air within the polishing room 38, and are effective in preventing contamination of polished wafers by preventing mist or solid particles generated by polishing from swirling upwards. In this case, the exhaust air is discharged to outdoors, but a part or all of the exhaust air may be re-circulated, or, in some cases, subjected to heat exchange between incoming and exhausting air to improve power conservation efficiency.

In this embodiment, the inside pressure of the polishing room 38 is adjusted so as to be less than its neighboring units within the polishing facility, such as a cleaning unit in which polished wafers are cleaned, or a wafer storage unit in which polished wafers or wafers to be polished are stored. This is because the polishing room 38 has the lowest cleanliness index within the polishing facility, so that the pressure differential is aimed at preventing contaminants from flowing out of the polishing room into the adjoining spaces.

A temperature sensor 48 is provided at a certain location in the polishing room 38 to control the ambient temperature in conjunction with the main controller 34, which controls the temperature of the supply air from the air conditioning apparatus 42 in accordance with an ambient temperature measured by the sensor 48 and a selected polishing temperature $T_0$. The temperature sensor 48 should detect a representative temperature of the ambient air in the polishing room 38, and it is preferable to take an average value of temperatures from several sensors placed around the room, as necessary.

Although one controller 34 is shared by control temperature adjusting devices 22, 32 and air conditioning apparatus 42, it is also permissible to provide a dedicated controller and sensors to each device, and an overall control may be assigned to a separate controller or one of such local controllers.

In the following, the control methodology of the polishing temperature using the polishing apparatus will be explained. Control methodology is based on controlling the polishing temperature by considering the temperature of the polishing space 38 in addition to those of the polishing solution Q and thermal medium C. "Polishing temperature" refers to the temperature at the polishing interface between the surface of the wafer being polished and the polishing surface on the polishing table or the polishing cloth mounted on top of the polishing table. Control methodology may be based on a number of parameters and objects for control and their combinations, and some specific examples will be presented.

Figure 2:
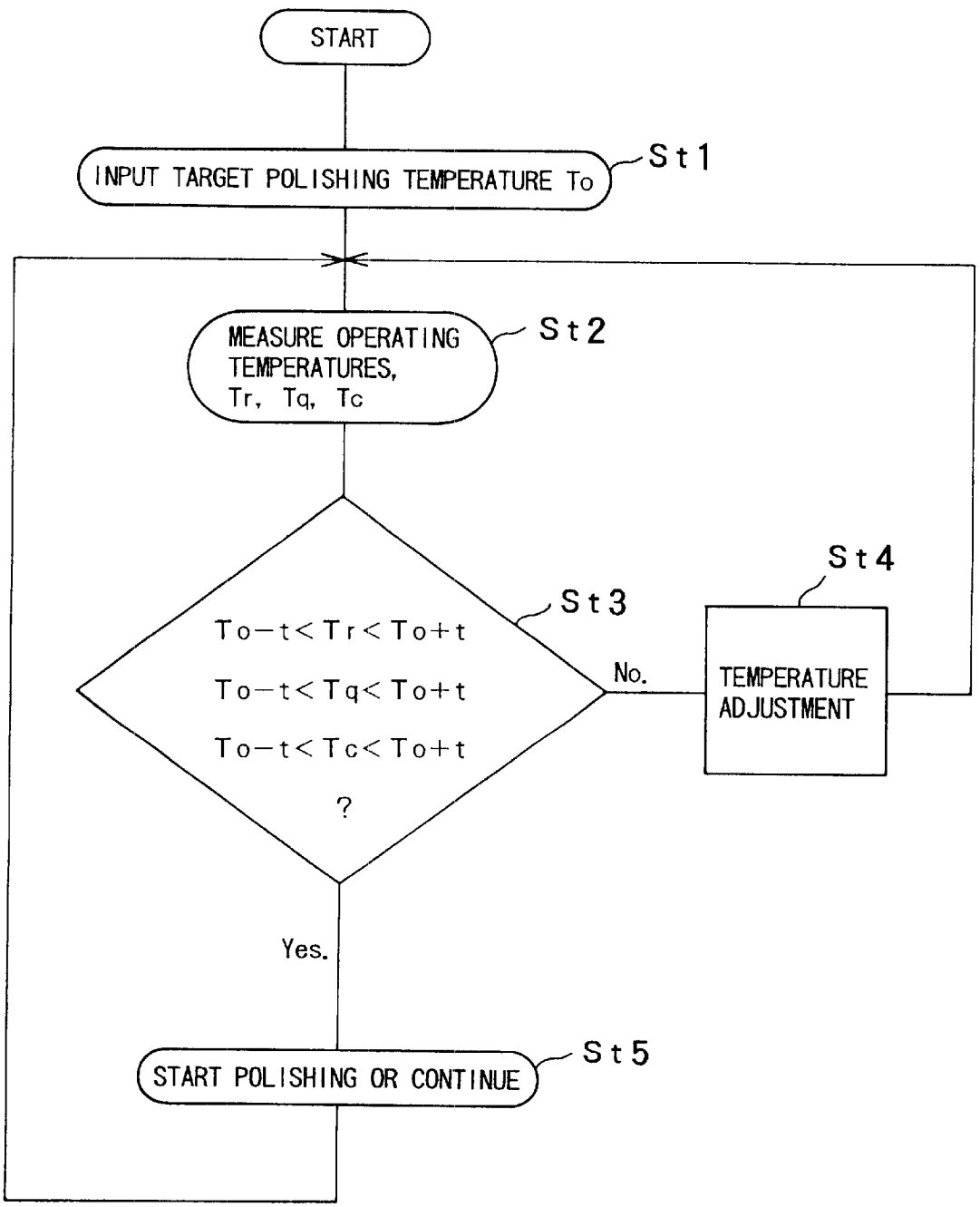
FIG. 2 is a flowchart for control methodology of the present invention.

FIG. 2 shows a first control methodology for controlling the polishing process so that polishing is commenced after confirming that a target temperature has been reached substantially in the polishing room 38, polishing solution Q and thermal medium C.

In step 1, a target polishing temperature To is input into controller 34, e.g. a computer. Target polishing temperature To is pre-determined through results obtained by trial polishing employing suitable processing conditions such as the nature of the workpiece to be polished, polishing tools, polishing solution and polishing speed. Polishing solution Q and thermal medium C may be pre-heated to a temperature near the target temperature.

In step 2, temperature sensors 48, 20 and 30 detect the ambient temperature Tr, solution temperature Tq and thermal medium temperature Tc within the polishing table 12, respectively.

In step 3, controller 34 examines whether the measured temperatures are within an allowable range of the target temperature.

If one or more operating temperatures are out of the allowable range, then in step 4, the controller 34 activates the temperature adjusting device 22, 32 or air conditioning apparatus 42 to adjust the operating temperature(s), and returning to step 2, the sensors are asked to re-check the temperatures. When all the operating temperatures are within or have reached the allowable range, then in step 5, polishing is started.

After starting polishing, the program returns to step 2 to re-measure the operating temperatures, and the control action is repeated by following either of the two loops, steps 2, 3, 4→2 or steps 2, 3, 5→2, to constantly maintain all the temperatures within the allowable range of the target polishing temperature To.

According to this methodology, if the target polishing temperature To is selected to be 16° C. and the allowable range to 2° C., the temperatures of polishing solution Q, thermal medium C for the polishing table 12 and polishing space 38 are all maintained at 16±2° C. Therefore, heat transfer to the space 38 is essentially eliminated and the temperature of the surface being polished can be maintained precisely, thereby producing a uniformly flat surface on the wafer and an appropriate removal rate of the surface material determined by the nature of the workpiece to be polished.

The Table below shows the results of trials to compare the polishing temperatures, i.e., surface temperatures of cloth 10, during the method according to the invention where temperature control over polishing solution Q, thermal medium C and polishing room 38 is conducted, with that during a conventional method where temperature control only over polishing solution Q and thermal medium C is conducted.

|  | Case 1 | Case 2 | Conventional |
| --- | --- | --- | --- |
| Polishing Solution | 15° C. | 40° C. | 15° C. |
| Thermal Medium | 15 | 40 | 15 |
| Polishing Room | 16 | 39 | 23 |
| Polishing Temperature | 17 | 39 | 23 |
| Target Temperature | 16 | 40 | 16 |

These results show that the polishing temperature can be controlled precisely by controlling the temperatures of, not only the polishing solution Q and thermal medium C for the polishing table 12, but also that of the polishing room 38. The temperature of polishing room 38 can be controlled by controlling the air temperature using a normal air conditioner 42 in an arrangement shown in FIG. 1.

The first method described above is based on controlling separately individual temperatures for solution Q, thermal medium C and polishing room 38 so that the method itself is simple and highly practical. Provision may be made to sound an alarm or stop operation to alert for an excessive deviation in any of the temperatures, if necessary.

A second methodology for polishing temperature control will be explained in the following. In the second method, the ambient temperature is not the object of control but it is used as a guiding parameter to control the temperatures of other parameters such as the polishing solution Q and thermal medium C of the polishing table 12. Specifically, when the temperature of the polishing space 38 is higher than the target polishing temperature To, the polishing temperature tends to become higher than that when the temperature of the polishing space 38 is To. Under such conditions, the solution and medium temperatures are maintained lower to compensate for temperature increases which would be caused by the higher temperature in the polishing space 38.

This method is appropriate when the polishing apparatus is located, not in a divided enclosure such as the one shown FIG. 1, but in a larger space such as a normal undivided clean room or other large space where it is not desirable to change the polishing ambient temperature by considering only the requirements of the polishing apparatus, or when the air density in the polishing space is so low that the ambient temperature control is difficult.

Figure 3:
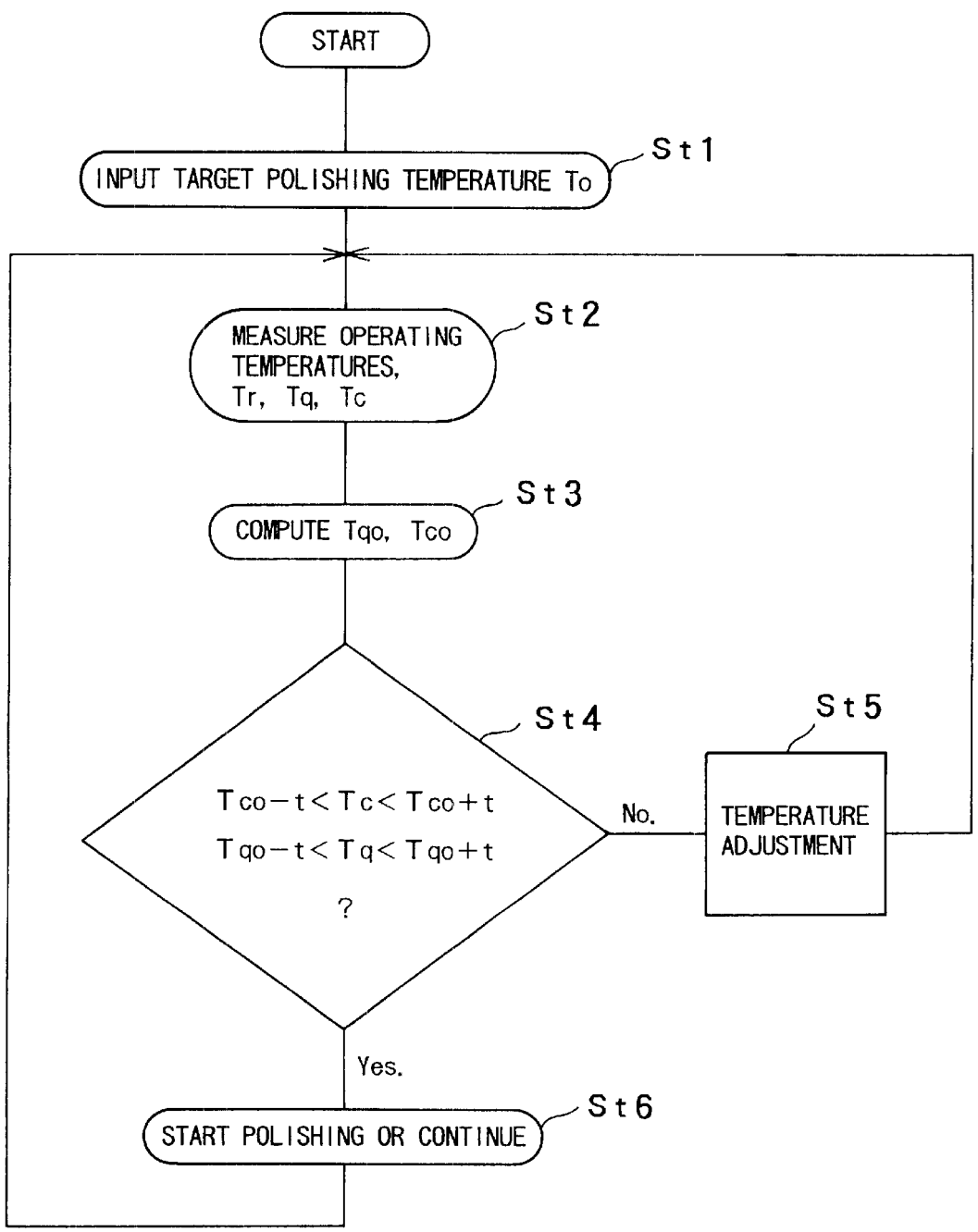
FIG. 3 is a flowchart for another control methodology of the present invention.

FIG. 3 shows a flowchart for the second methodology.

In step 1, a target polishing temperature To is input into a computer controller 34, e.g. a computer, and in step 2, temperature sensors 48, 20, 30 detect the ambient temperature Tr, solution temperature Tq and thermal medium temperature Tc. In step 3, computer 34 calculates target temperatures Tqo and Tco, respectively, for the solution temperature Tq and the medium temperature Tc based on the measured temperatures, according to the following equations, for example:

$$Tqo=To-k_1DT,$$

$$Tco=To-k_2DT$$

where DT=Tr−To, and $k_1$, $k_2$ are experimentally determined constants.

In step 4, measured temperatures Tq, Tc are compared with the target temperatures Tqo, Tco, and if the operating temperatures are not within an allowable range, the program proceeds to step 5 to adjust the operating temperatures by activating the respective adjusting devices 22, 32, and returns to step S2 to re-check the current temperatures.

When all the operating temperatures are at or have been adjusted to the allowable range, polishing is started in step 6. After polishing is started, the program returns to step 2 to re-check the temperatures, and such control procedure is repeated by following either of the two loops, steps 2, 3, 4, 5→2 or steps 2, 3, 4, 6→2 so that the temperatures Tq and Tc are maintained within the allowable range.

According to this methodology, if the target polishing temperature To is selected to be 16° C. and the allowable range to be 2° C., the temperatures of polishing solution Q, thermal medium C for the polishing table 12 are controlled so as to compensate for the temperature differences between the polishing space temperature Tr and the target polishing temperature To. Thus, the temperature of the surface being polished will be maintained at the target polishing temperature To precisely, thereby producing a uniform removal rate determined suitably for the workpiece to be polished and a uniform flatness within a workpiece surface.

The Table below shows the results of polishing temperature measurements according to the second methodology.

|  | Case 3 | Case 4 | Conventional |
| --- | --- | --- | --- |
| Polishing Solution | 10° C. | 48° C. | 15° C. |
| Thermal Medium | 10 | 47 | 15 |
| Polishing Room | 23 | 23 | 23 |
| Polishing Temperature | 17 | 39 | 23 |
| Target Temperature | 16 | 40 | 16 |

In this embodiment, ambient temperature of the polishing room 38 was used only as a guiding parameter and was not controlled, but it is obvious that the ambient temperature can be controlled within a range compatible with other required conditions.

Also, the method may be based on measuring the polishing temperature, i.e., cloth temperature of the cloth 10 or the object temperature of workpiece W, by suitable means and adjusting the control parameters including ambient temperature according to the measured results. Such temperature sensors may be selected from available sensor types such as sensors embedded in polishing table 12 or top ring 14 or remote radiation type such as infrared sensors which can measure the cloth temperature in a non-contact manner.

What is claimed is:

1. A polishing apparatus for polishing a surface of a workpiece, said apparatus comprising:
    a polishing unit having a polishing tool providing a polishing surface and a workpiece holding device for holding the workpiece;
    an enclosing structure defining a polishing space separated from a surrounding environment, said polishing unit being housed within said polishing space;
    a polishing solution supply device for supplying a polishing solution to a polishing interface between the surface of the workpiece and said polishing surface; and
    a polishing temperature control device for controlling a temperature of said polishing interface by adjusting a temperature of said polishing space in response to a detected temperature at said polishing interface.

2. An apparatus as claimed in claim 1, wherein said polishing temperature control device is operable to adjust said temperature to a predetermined temperature.

3. An apparatus as claimed in claim 1, wherein said polishing temperature control device is operable to adjust a solution temperature in said polishing solution supply device to a predetermined temperature.

4. An apparatus as claimed in claim 1, wherein said polishing temperature control device is operable to adjust a temperature of a thermal medium flowing in an internal passage in said polishing tool to a predetermined temperature.

5. An apparatus as claimed in claim 1, wherein said polishing temperature control device comprises a sensor for detecting a temperature of said polishing surface.

6. An apparatus as claimed in claim 1, wherein said polishing temperature control device is operable to adjust a temperature of air supplied to said polishing space.

7. An apparatus as claimed in claim 6, wherein said air is supplied to said polishing space in the form of a downflow.

8. A polishing apparatus for polishing a surface of a workpiece, said apparatus comprising:
    a polishing unit having a polishing tool providing a polishing surface and a workpiece holding device for holding the workpiece;
    an enclosing structure defining a polishing space separated from a surrounding environment, said polishing unit being housed within said polishing space;
    a polishing solution supply device for supplying a polishing solution to a polishing interface between the surface of the workpiece and said polishing surface;
    a temperature sensor for detecting a temperature of said polishing space; and
    a polishing temperature control device for controlling a polishing temperature said polishing interface based on the thus detected temperature.

9. An apparatus as claimed in claim 8, wherein said polishing temperature control device is operable to adjust said temperature to a predetermined temperature.

10. An apparatus as claimed in claim 8, wherein said polishing temperature control device is operable to adjust a temperature of said polishing solution to a predetermined temperature.

11. An apparatus as claimed in claim 8, wherein said polishing temperature control device is operable to adjust a temperature of a thermal medium flowing in an internal passage in said polishing tool to a predetermined temperature.

12. An apparatus as claimed in claim 8, wherein said polishing temperature control device includes a sensor for detecting a temperature of said polishing surface.

13. An apparatus as claimed in claim 8, wherein said polishing temperature control device is operable to adjust a temperature of air supplied to said polishing space.

14. An apparatus as claimed in claim 13, wherein said air is supplied to said polishing space in the form of a downflow.

15. A method for controlling a surface temperature of a workpiece being polished in a polishing apparatus including a polishing unit having a polishing tool providing a polishing surface and a workpiece holding device for holding the workpiece, and a polishing solution supply device for supplying a polishing solution to a polishing interface between the surface of the workpiece and said polishing surface, said method comprising:

controlling a temperature of said polishing interface to a target temperature by controlling respective temperatures of said polishing solution, a thermal medium flowing internally in said polishing tool, and a polishing space defined by an enclosing structure separating said polishing space from a surrounding environment, with said polishing unit being housed in said polishing space.

16. A method as claimed in claim 15, comprising maintaining said respective temperatures substantially the same.

17. A method as claimed in claim 15, comprising controlling said respective temperatures as a function of a detected temperature of said polishing interface.

18. A method for controlling a surface temperature of a workpiece being polished in a polishing apparatus including a polishing unit having a polishing tool providing a polishing surface and a workpiece holding device for holding the workpiece, and a polishing solution supply device for supplying a polishing solution to a polishing interface between the surface of the workpiece and said polishing surface, said method comprising:

controlling a temperature of said polishing solution prior to said polishing solution being supplied to said polishing interface as a function of temperature in a polishing space defined by an enclosing structure separating said polishing space from a surrounding environment, with said polishing unit being housed in said polishing space, and a target polishing temperature.

19. A method as claimed in claim 18, further comprising maintaining a temperature of said polishing tool at a predetermined temperature by controlling a temperature of a medium circulating internally in said polishing tool.

20. A polishing apparatus for polishing a surface of a workpiece, said apparatus comprising:

a polishing unit having a polishing tool providing a polishing surface and a workpiece holding device for holding the workpiece;

an enclosing structure defining a polishing space separated from a surrounding environment, said polishing unit being housed within said polishing space;

a polishing solution supply device for supplying a polishing solution to a polishing interface between the surface of the workpiece and said polishing surface; and a control device for controlling a temperature of said polishing interface to a target temperature by separately controlling respective temperatures of said polishing solution, a thermal fluid flowing internally in said polishing tool, and said polishing space.

21. An apparatus as claimed in claim 20, wherein said control device is operable to control said respective temperatures to respective target temperatures.

22. A polishing apparatus for polishing a surface of a workpiece, said apparatus comprising:

a polishing unit having a polishing tool providing a polishing surface and a workpiece holding device for holding the workpiece;

a polishing solution supply device for supplying a polishing solution to a polishing interface between the surface of the workpiece and said polishing surface; and a polishing temperature control device for controlling a temperature of the polishing interface, said polishing temperature control device comprising:

a solution temperature control device including a sensor for measuring a temperature of the polishing solution and operable to maintain the thus measured temperature at a target temperature; and a thermal medium temperature control device including a sensor for measuring a temperature of a thermal medium flowing internally in said polishing tool and operable to maintain the thus measured temperature at a target temperature.

23. An apparatus as claimed in claim 22, wherein said solution temperature control device and said thermal temperature control device are separate devices.

24. A polishing apparatus for polishing a surface of a workpiece, said apparatus comprising:

a polishing unit having a polishing tool providing a polishing surface and a workpiece holding device for holding the workpiece;

an enclosing structure defining a polishing space separated from a surrounding environment, said polishing unit being housed within said polishing space;

a polishing solution supply device for supplying a polishing solution to a polishing interface between the surface of the workpiece and said polishing surface; and a polishing temperature control device for controlling a temperature of said polishing interface by adjusting a temperature of said polishing space such that flatness of the workpiece polished by said polishing surface along with controlling the temperature of said polishing interface by adjusting the temperature of said polishing space is more uniform than flatness of a workpiece polished by said polishing surface absent the controlling of the temperature of said polishing interface by adjusting the temperature of said polishing space.

25. An apparatus as claimed in claim 24, wherein said polishing temperature control device is operable to adjust said temperature to a predetermined temperature.

26. An apparatus as claimed in claim 24, wherein said polishing temperature control device is operable to adjust a solution temperature in said polishing solution supply device to a predetermined temperature.

27. An apparatus as claimed in claim 24, wherein said polishing temperature control device is operable to adjust a temperature of a thermal medium flowing in an internal passage in said polishing tool to a predetermined temperature.

28. An apparatus as claimed in claim 24, wherein said polishing temperature control device comprises a sensor for detecting a temperature of said polishing surface.

29. An apparatus as claimed in claim 24, wherein said polishing temperature control device is operable to adjust a temperature of air supplied to said polishing space.

30. An apparatus as claimed in claim 29, wherein said air is supplied to said polishing space in the form of a downflow.

\* \* \* \* \*